(12) United States Patent
Sinha et al.

(10) Patent No.: US 8,389,385 B2
(45) Date of Patent: Mar. 5, 2013

(54) SEMICONDUCTOR MATERIAL MANUFACTURE (75) Inventors: Nishant Sinha, Boise, ID (US); Gurtej S. Sandhu, Boise, ID (US); John Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/088,863

(22) Filed: Apr. 18, 2011

(65) Prior Publication Data

US 2011/0193190 A1 Aug. 11, 2011

Related U.S. Application Data (62) Division of application No. 12/365,734, filed on Feb. 4, 2009, now Pat. No. 7,927,975.

(51) Int. Cl.
 H01L 21/00 (2006.01)

(52) U.S. Cl. ........ 438/463; 438/458; 438/464; 438/520; 438/528; 257/E21.568

(58) Field of Classification Search .......... 438/403, 438/406, 407, 458, 463, 464, 520, 528; 257/E21.568
See application file for complete search history.

(56) References Cited

U.S. PATENT DOCUMENTS

| | | | |
|---|---|---|---|
| 5,091,331 A | 2/1992 | Delgado et al. | |
| 5,102,821 A | 4/1992 | Moslehi | |
| 5,131,968 A | 7/1992 | Wells et al. | |
| H1137 H | 2/1993 | Easter et al. | |
| 5,183,769 A | 2/1993 | Rutter et al. | |
| H1174 H | 4/1993 | Easter et al. | |
| 5,213,986 A | 5/1993 | Pinker et al. | |
| 5,236,118 A | 8/1993 | Bower et al. | |
| 5,283,107 A | 2/1994 | Bayer et al. | |
| 5,349,207 A | 9/1994 | Malhi | |
| 5,355,022 A | 10/1994 | Sugahara | |
| 5,413,952 A | 5/1995 | Pages et al. | |
| 5,427,638 A | 6/1995 | Goetz et al. | |
| 5,435,881 A | 7/1995 | Ogle | |
| 5,441,911 A | 8/1995 | Malhi | |
| 5,503,704 A | 4/1996 | Bower et al. | |
| 5,504,376 A | 4/1996 | Sugahara et al. | |
| 5,746,883 A | 5/1998 | Cha et al. | |
| 5,783,022 A | 7/1998 | Cha et al. | |
| 5,804,494 A | 9/1998 | Mitani et al. | |
| 5,818,631 A | 10/1998 | Askinazi et al. | |
| 5,863,375 A | 1/1999 | Cha et al. | |

(Continued)

FOREIGN PATENT DOCUMENTS

DE 2832152 1/1979
DE 297734 A5 1/1992

(Continued)

OTHER PUBLICATIONS

"Expanding the Horizons of Technology, Phoenix Series V2, Wafer Management Systems", MGI Systems, publication SL-301R, (May 1989).

(Continued)

*Primary Examiner* — Michelle Mandala
(74) *Attorney, Agent, or Firm* — Schwegman, Lundberg & Woessner, P.A.

(57) ABSTRACT

Electronic apparatus, systems, and methods include a semiconductor layer bonded to a bulk region of a wafer or a substrate, in which the semiconductor layer can be bonded to the bulk region using electromagnetic radiation. Additional apparatus, systems, and methods are disclosed.

16 Claims, 7 Drawing Sheets

U.S. PATENT DOCUMENTS

| | | |
|---|---|---|
| 5,945,012 A | 8/1999 | Chan |
| 5,953,620 A | 9/1999 | Katou et al. |
| 5,985,742 A | 11/1999 | Henley et al. |
| 5,994,207 A | 11/1999 | Henley |
| 6,004,866 A | 12/1999 | Nakano et al. |
| 6,010,579 A | 1/2000 | Henley et al. |
| 6,013,563 A | 1/2000 | Henley et al. |
| 6,013,567 A | 1/2000 | Henley et al. |
| 6,020,252 A | 2/2000 | Aspar et al. |
| 6,033,974 A | 3/2000 | Henley et al. |
| 6,048,411 A | 4/2000 | Henley et al. |
| 6,051,073 A | 4/2000 | Chu et al. |
| 6,083,324 A | 7/2000 | Henley et al. |
| 6,103,597 A | 8/2000 | Aspar et al. |
| 6,103,599 A | 8/2000 | Henley et al. |
| 6,110,802 A | 8/2000 | Aspar et al. |
| 6,113,735 A | 9/2000 | Chu et al. |
| 6,120,660 A | 9/2000 | Chu et al. |
| 6,146,979 A | 11/2000 | Henley et al. |
| 6,153,524 A | 11/2000 | Henley et al. |
| 6,155,909 A | 12/2000 | Henley et al. |
| 6,156,621 A | 12/2000 | Nance et al. |
| 6,159,824 A | 12/2000 | Henley et al. |
| 6,159,825 A | 12/2000 | Henley et al. |
| 6,162,705 A | 12/2000 | Henley et al. |
| 6,171,965 B1 | 1/2001 | Kang et al. |
| 6,180,496 B1 | 1/2001 | Farrens et al. |
| 6,184,111 B1 | 2/2001 | Henley et al. |
| 6,186,091 B1 | 2/2001 | Chu |
| 6,187,110 B1 | 2/2001 | Henley et al. |
| 6,190,998 B1 | 2/2001 | Bruel et al. |
| 6,197,695 B1 | 3/2001 | Joly et al. |
| 6,204,079 B1 | 3/2001 | Aspar et al. |
| 6,204,151 B1 | 3/2001 | Malik et al. |
| 6,207,005 B1 | 3/2001 | Henley et al. |
| 6,213,050 B1 | 4/2001 | Liu et al. |
| 6,217,724 B1 | 4/2001 | Chu et al. |
| 6,221,740 B1 | 4/2001 | Bryan et al. |
| 6,221,774 B1 | 4/2001 | Malik |
| 6,225,192 B1 | 5/2001 | Aspar et al. |
| 6,228,176 B1 | 5/2001 | Chu et al. |
| 6,245,161 B1 | 6/2001 | Henley et al. |
| 6,248,649 B1 | 6/2001 | Henley et al. |
| 6,263,941 B1 | 7/2001 | Bryan et al. |
| 6,265,328 B1 | 7/2001 | Henley et al. |
| 6,269,765 B1 | 8/2001 | Chu et al. |
| 6,274,459 B1 | 8/2001 | Chan |
| 6,284,631 B1 | 9/2001 | Henley et al. |
| 6,287,941 B1 | 9/2001 | Kang et al. |
| 6,290,804 B1 | 9/2001 | Henley et al. |
| 6,291,313 B1 | 9/2001 | Henley et al. |
| 6,291,314 B1 | 9/2001 | Henley et al. |
| 6,291,326 B1 | 9/2001 | Henley et al. |
| 6,294,814 B1 | 9/2001 | Henley et al. |
| 6,300,227 B1 | 10/2001 | Liu et al. |
| 6,303,468 B1 | 10/2001 | Aspar et al. |
| 6,316,333 B1 | 11/2001 | Bruel et al. |
| 6,321,134 B1 | 11/2001 | Henley et al. |
| 6,335,258 B1 | 1/2002 | Aspar et al. |
| 6,335,264 B1 | 1/2002 | Henley et al. |
| 6,338,313 B1 | 1/2002 | Chan |
| 6,362,077 B1 | 3/2002 | Aspar et al. |
| 6,383,890 B2 | 5/2002 | Takisawa et al. |
| 6,391,740 B1 | 5/2002 | Cheung et al. |
| 6,403,450 B1 | 6/2002 | Maleville et al. |
| 6,423,613 B1 | 7/2002 | Geusic |
| 6,429,094 B1 | 8/2002 | Maleville et al. |
| 6,448,152 B1 | 9/2002 | Henley et al. |
| 6,455,399 B2 | 9/2002 | Malik et al. |
| 6,458,672 B1 | 10/2002 | Henley et al. |
| 6,458,723 B1 | 10/2002 | Henley et al. |
| 6,465,327 B1 | 10/2002 | Aspar et al. |
| 6,468,879 B1 | 10/2002 | Lamure et al. |
| 6,486,041 B2 | 11/2002 | Henley et al. |
| 6,500,268 B1 | 12/2002 | Henley |
| 6,500,732 B1 | 12/2002 | Henley et al. |
| 6,511,899 B1 | 1/2003 | Henley et al. |
| 6,513,564 B2 | 2/2003 | Bryan et al. |
| 6,514,838 B2 | 2/2003 | Chan |
| 6,528,391 B1 | 3/2003 | Henley et al. |
| 6,534,381 B2 | 3/2003 | Cheung et al. |
| 6,544,837 B1 | 4/2003 | Divakauni et al. |
| 6,544,862 B1 | 4/2003 | Bryan |
| 6,548,382 B1 | 4/2003 | Henley et al. |
| 6,554,046 B1 | 4/2003 | Bryan et al. |
| 6,558,802 B1 | 5/2003 | Henley et al. |
| 6,582,999 B2 | 6/2003 | Henley et al. |
| 6,590,258 B2 | 7/2003 | Divakauni et al. |
| 6,593,036 B1 | 7/2003 | Robic et al. |
| 6,596,610 B1 | 7/2003 | Kuwabara et al. |
| 6,616,854 B2 | 9/2003 | Jones et al. |
| 6,630,713 B2 | 10/2003 | Geusic |
| 6,632,324 B2 | 10/2003 | Chan |
| 6,632,724 B2 | 10/2003 | Henley et al. |
| 6,645,828 B1 | 11/2003 | Farrens et al. |
| 6,684,889 B2 | 2/2004 | Cavazza |
| 6,720,640 B2 | 4/2004 | Kuwabara et al. |
| 6,756,285 B1 | 6/2004 | Moriceau et al. |
| 6,756,286 B1 | 6/2004 | Moriceau et al. |
| 6,780,759 B2 | 8/2004 | Farrens et al. |
| 6,787,885 B2 | 9/2004 | Esser et al. |
| 6,790,747 B2 | 9/2004 | Henley et al. |
| 6,794,276 B2 | 9/2004 | Letertre et al. |
| 6,806,171 B1 | 10/2004 | Ulyashin et al. |
| 6,808,967 B1 | 10/2004 | Aspar et al. |
| 6,809,009 B2 | 10/2004 | Aspar et al. |
| 6,809,044 B1 | 10/2004 | Aspar et al. |
| 6,815,309 B2 | 11/2004 | Letertre et al. |
| 6,821,376 B1 | 11/2004 | Rayssac et al. |
| 6,828,216 B2 | 12/2004 | Schwarzenbach et al. |
| 6,830,985 B2 | 12/2004 | Oi |
| 6,833,314 B2 | 12/2004 | Maleville et al. |
| 6,853,414 B2 | 2/2005 | Aspar et al. |
| 6,853,802 B2 | 2/2005 | Neyret et al. |
| 6,855,619 B2 | 2/2005 | Iwasaki et al. |
| 6,864,155 B2 | 3/2005 | Wang |
| 6,867,067 B2 | 3/2005 | Ghyselen et al. |
| 6,881,596 B2 | 4/2005 | Malville et al. |
| 6,881,644 B2 | 4/2005 | Malik et al. |
| 6,884,694 B2 | 4/2005 | Park et al. |
| 6,884,697 B2 | 4/2005 | Schwarzenbach et al. |
| 6,890,838 B2 | 5/2005 | Henley et al. |
| 6,903,032 B2 | 6/2005 | Maleville et al. |
| 6,908,027 B2 | 6/2005 | Tolchinsky |
| 6,908,774 B2 | 6/2005 | Ghyselen et al. |
| 6,908,828 B2 | 6/2005 | Letertre et al. |
| 6,908,832 B2 | 6/2005 | Farrens et al. |
| 6,909,445 B2 | 6/2005 | Baleras |
| 6,911,379 B2 | 6/2005 | Yeo et al. |
| 6,913,971 B2 | 7/2005 | Aspar et al. |
| 6,936,523 B2 | 8/2005 | Berne et al. |
| 6,939,782 B2 | 9/2005 | Aspar et al. |
| 6,939,783 B2 | 9/2005 | Neyret et al. |
| 6,941,795 B2 | 9/2005 | Maleville |
| 6,942,750 B2 | 9/2005 | Chou et al. |
| 6,946,365 B2 | 9/2005 | Aspar et al. |
| 6,955,971 B2 | 10/2005 | Ghyselen et al. |
| 6,958,284 B2 | 10/2005 | Ghyselen |
| 6,959,863 B2 | 11/2005 | Figuet et al. |
| 6,969,668 B1 | 11/2005 | Kang et al. |
| 6,974,757 B2 | 12/2005 | Wang |
| 6,974,759 B2 | 12/2005 | Moriceau et al. |
| 6,975,016 B2 | 12/2005 | Kellar et al. |
| 6,984,570 B2 | 1/2006 | Wang |
| 6,987,051 B2 | 1/2006 | Schwarzenbach et al. |
| 6,989,314 B2 | 1/2006 | Rayssac et al. |
| 7,008,857 B2 | 3/2006 | Ghyselen et al. |
| 7,017,637 B2 | 3/2006 | Ueyama et al. |
| 7,022,586 B2 | 4/2006 | Maleville et al. |
| 7,029,548 B2 | 4/2006 | Aspar et al. |
| 7,033,905 B2 | 4/2006 | Ghyselen et al. |
| 7,037,804 B2 | 5/2006 | Kellar et al. |
| 7,045,878 B2 | 5/2006 | Faris |
| 7,048,867 B2 | 5/2006 | Maleville |
| 7,049,250 B2 | 5/2006 | Neyret et al. |
| 7,056,808 B2 | 6/2006 | Henley et al. |
| 7,056,809 B2 | 6/2006 | Rayssac |

| Patent/Publication | Date | Inventor(s) |
|---|---|---|
| 7,060,590 B2 | 6/2006 | Bressot et al. |
| 7,067,396 B2 | 6/2006 | Aspar et al. |
| 7,071,029 B2 | 7/2006 | Ghyselen et al. |
| 7,071,077 B2 | 7/2006 | Maleville et al. |
| 7,078,317 B2 | 7/2006 | Henley |
| 7,081,399 B2 | 7/2006 | Maleville et al. |
| 7,094,666 B2 | 8/2006 | Henley et al. |
| 7,138,325 B2 | 11/2006 | Maleville et al. |
| 7,138,344 B2 | 11/2006 | Neyret et al. |
| 7,145,219 B2 | 12/2006 | Faris |
| 7,147,709 B1 | 12/2006 | Ong et al. |
| 7,148,565 B2 | 12/2006 | Kim et al. |
| 7,157,787 B2 | 1/2007 | Kim et al. |
| 7,160,790 B2 | 1/2007 | Henley |
| 7,161,224 B2 | 1/2007 | Tolchinsky et al. |
| 7,163,826 B2 | 1/2007 | Faris |
| 7,166,520 B1 | 1/2007 | Henley |
| 7,179,719 B2 | 2/2007 | Droes et al. |
| 7,182,234 B2 | 2/2007 | Rayssac et al. |
| 7,183,177 B2 | 2/2007 | Al-Bayati et al. |
| 7,183,179 B2 | 2/2007 | Droes et al. |
| 7,187,162 B2 | 3/2007 | Kerdiles et al. |
| 7,189,304 B2 | 3/2007 | Martinez et al. |
| 7,190,029 B2 | 3/2007 | Neyret et al. |
| 7,192,841 B2 | 3/2007 | Wei et al. |
| 7,205,211 B2 | 4/2007 | Aspar et al. |
| 7,225,095 B2 | 5/2007 | Bras |
| 7,229,899 B2 | 6/2007 | Moriceau et al. |
| 7,235,461 B2 | 6/2007 | Maleville et al. |
| 7,238,598 B2 | 7/2007 | Lagahe et al. |
| 7,244,990 B2 | 7/2007 | Takafuji et al. |
| 7,253,081 B2 | 8/2007 | Kang et al. |
| 7,256,075 B2 | 8/2007 | Ghyselen et al. |
| 7,258,743 B2 | 8/2007 | Fournel et al. |
| 7,264,996 B2 | 9/2007 | Moriceau et al. |
| 7,265,030 B2 | 9/2007 | Maa et al. |
| 7,271,445 B2 | 9/2007 | Forbes |
| 7,273,788 B2 | 9/2007 | Forbes |
| 7,276,428 B2 | 10/2007 | Daval et al. |
| 7,282,449 B2 | 10/2007 | Daval et al. |
| 7,285,471 B2 | 10/2007 | Maleville et al. |
| 7,294,557 B2 | 11/2007 | Maleville |
| 7,297,611 B2 | 11/2007 | Maleville |
| 7,300,856 B2 | 11/2007 | Schwarzenbach et al. |
| 7,312,153 B2 | 12/2007 | Coletti et al. |
| 7,326,628 B2 | 2/2008 | Mohamed et al. |
| 7,326,629 B2 | 2/2008 | Nagarajan et al. |
| 7,338,882 B2 | 3/2008 | Park et al. |
| 7,341,927 B2 | 3/2008 | Atwater, Jr. et al. |
| 7,348,258 B2 | 3/2008 | Henley et al. |
| 7,351,644 B2 | 4/2008 | Henley |
| 7,354,815 B2 | 4/2008 | Henley |
| 7,358,152 B2 | 4/2008 | Kub et al. |
| 7,361,574 B1 | 4/2008 | Maa et al. |
| 7,368,030 B2 | 5/2008 | Jaussaud et al. |
| 7,371,661 B2 | 5/2008 | Chang |
| 7,371,662 B2 | 5/2008 | Chiou |
| 7,385,283 B2 | 6/2008 | Wu et al. |
| 7,732,301 B1 | 6/2010 | Pinnington et al. |
| 2001/0007789 A1 | 7/2001 | Aspar et al. |
| 2002/0022337 A1 | 2/2002 | Maleville et al. |
| 2002/0055266 A1 | 5/2002 | Henley et al. |
| 2002/0081823 A1 | 6/2002 | Cheung et al. |
| 2002/0090758 A1 | 7/2002 | Henley et al. |
| 2002/0094668 A1 | 7/2002 | Aspar et al. |
| 2003/0003684 A1 | 1/2003 | Farrens et al. |
| 2003/0008477 A1 | 1/2003 | Kang et al. |
| 2003/0047289 A1 | 3/2003 | Jaussaud et al. |
| 2003/0052945 A1 | 3/2003 | Baleras et al. |
| 2003/0060020 A1 | 3/2003 | Walitzki |
| 2003/0077885 A1 | 4/2003 | Aspar et al. |
| 2003/0092244 A1 | 5/2003 | Oi et al. |
| 2003/0113983 A1 | 6/2003 | Henley et al. |
| 2003/0124815 A1 | 7/2003 | Henley et al. |
| 2003/0134489 A1 | 7/2003 | Schwarzenbach et al. |
| 2003/0175531 A1 | 9/2003 | Fournel et al. |
| 2003/0216008 A1 | 11/2003 | Schwarzenbach et al. |
| 2003/0219957 A1 | 11/2003 | Kuwabara et al. |
| 2003/0234075 A1 | 12/2003 | Aspar et al. |
| 2004/0001959 A1 | 1/2004 | Schwartz et al. |
| 2004/0014299 A1 | 1/2004 | Moriceau et al. |
| 2004/0029358 A1 | 2/2004 | Park et al. |
| 2004/0058555 A1 | 3/2004 | Moriceau et al. |
| 2004/0069045 A1 | 4/2004 | Maleville |
| 2004/0069321 A1 | 4/2004 | Maleville et al. |
| 2004/0081790 A1 | 4/2004 | Maleville |
| 2004/0082147 A1 | 4/2004 | Aspar et al. |
| 2004/0082148 A1 | 4/2004 | Maleville |
| 2004/0084401 A1 | 5/2004 | Aspar et al. |
| 2004/0092087 A1 | 5/2004 | Aspar et al. |
| 2004/0097055 A1 | 5/2004 | Henley et al. |
| 2004/0104272 A1 | 6/2004 | Figuet et al. |
| 2004/0106303 A1 | 6/2004 | Neyret et al. |
| 2004/0110320 A1 | 6/2004 | Aspar et al. |
| 2004/0112866 A1 | 6/2004 | Maleville et al. |
| 2004/0121557 A1 | 6/2004 | Ghyselen |
| 2004/0132304 A1 | 7/2004 | Farrens et al. |
| 2004/0151483 A1 | 8/2004 | Neyret et al. |
| 2004/0161904 A1 | 8/2004 | Berne et al. |
| 2004/0161948 A1 | 8/2004 | Maleville et al. |
| 2004/0166649 A1 | 8/2004 | Bressot et al. |
| 2004/0166651 A1 | 8/2004 | Aspar et al. |
| 2004/0180519 A1 | 9/2004 | Schwarzenbach et al. |
| 2004/0188501 A1 | 9/2004 | Tolchinsky et al. |
| 2004/0197963 A1 | 10/2004 | Neyret et al. |
| 2004/0209441 A1 | 10/2004 | Maleville et al. |
| 2004/0209449 A1 | 10/2004 | Maleville et al. |
| 2004/0222500 A1 | 11/2004 | Aspar et al. |
| 2004/0241959 A1 | 12/2004 | Letertre et al. |
| 2004/0248379 A1 | 12/2004 | Maleville et al. |
| 2004/0252931 A1 | 12/2004 | Belleville et al. |
| 2005/0026394 A1 | 2/2005 | Letertre et al. |
| 2005/0026426 A1 | 2/2005 | Maleville et al. |
| 2005/0028727 A1 | 2/2005 | Schwarzenbach et al. |
| 2005/0029224 A1 | 2/2005 | Aspar et al. |
| 2005/0070071 A1 | 3/2005 | Henley et al. |
| 2005/0070073 A1 | 3/2005 | Al-Bayati et al. |
| 2005/0094990 A1 | 5/2005 | Neyret et al. |
| 2005/0101104 A1 | 5/2005 | Schwarzenbach et al. |
| 2005/0101105 A1 | 5/2005 | Ghyselen et al. |
| 2005/0112847 A1 | 5/2005 | Moriceau et al. |
| 2005/0118754 A1 | 6/2005 | Henley et al. |
| 2005/0124138 A1 | 6/2005 | Aspar et al. |
| 2005/0150597 A1 | 7/2005 | Henley et al. |
| 2005/0158634 A1 | 7/2005 | Thony et al. |
| 2005/0164471 A1 | 7/2005 | Maleville |
| 2005/0173781 A1 | 8/2005 | Tolchinsky et al. |
| 2005/0178495 A1 | 8/2005 | Aspar et al. |
| 2005/0186758 A1 | 8/2005 | Henley et al. |
| 2005/0218111 A1 | 10/2005 | Maleville et al. |
| 2005/0221583 A1 | 10/2005 | Aspar et al. |
| 2005/0227425 A1 | 10/2005 | Henley |
| 2005/0230754 A1 | 10/2005 | Neyret et al. |
| 2005/0233545 A1 | 10/2005 | Henley et al. |
| 2005/0247668 A1 | 11/2005 | Malik et al. |
| 2005/0270867 A1 | 12/2005 | Jaussaud et al. |
| 2005/0277278 A1 | 12/2005 | Maleville et al. |
| 2006/0019476 A1 | 1/2006 | Lagahe et al. |
| 2006/0024917 A1 | 2/2006 | Henley et al. |
| 2006/0030167 A1 | 2/2006 | Henley |
| 2006/0035445 A1 | 2/2006 | Neyret et al. |
| 2006/0040470 A1 | 2/2006 | Mohamed et al. |
| 2006/0054973 A1 | 3/2006 | Schwarzenbach et al. |
| 2006/0076578 A1 | 4/2006 | Ghyselen et al. |
| 2006/0079071 A1 | 4/2006 | Moriceau et al. |
| 2006/0115961 A1 | 6/2006 | Aspar et al. |
| 2006/0124584 A1 | 6/2006 | Maleville |
| 2006/0131687 A1 | 6/2006 | Henley |
| 2006/0138583 A1 | 6/2006 | Henley |
| 2006/0141746 A1 | 6/2006 | Delattre et al. |
| 2006/0141747 A1 | 6/2006 | Henley et al. |
| 2006/0154442 A1 | 7/2006 | de Souza et al. |
| 2006/0160329 A1 | 7/2006 | Henley et al. |
| 2006/0166461 A1 | 7/2006 | Fournel et al. |
| 2006/0166472 A1 | 7/2006 | Henley et al. |
| 2006/0172508 A1 | 8/2006 | Maleville et al. |
| 2006/0191627 A1 | 8/2006 | Aspar et al. |
| 2006/0205180 A1 | 9/2006 | Henley et al. |

| | | | | | | |
|---|---|---|---|---|---|---|
| 2006/0211219 A1 | 9/2006 | Henley et al. | | JP | 54155770 | 12/1979 |
| 2006/0223283 A1 | 10/2006 | Maleville et al. | | JP | 59054217 A | 3/1984 |
| 2006/0240645 A1 | 10/2006 | Henley | | JP | 59098533 A | 6/1984 |
| 2006/0270187 A1 | 11/2006 | Kerdiles et al. | | JP | 59174549 A | 10/1984 |
| 2006/0273068 A1 | 12/2006 | Tussot et al. | | JP | 60003148 A | 1/1985 |
| 2006/0281212 A1 | 12/2006 | Moriceau et al. | | JP | 60046976 A | 3/1985 |
| 2007/0026638 A1 | 2/2007 | Henley | | JP | 60136223 A | 7/1985 |
| 2007/0026692 A1 | 2/2007 | Maleville et al. | | JP | 60165719 | 8/1985 |
| 2007/0029043 A1 | 2/2007 | Henley | | JP | 60178629 | 9/1985 |
| 2007/0032044 A1 | 2/2007 | Henley | | JP | 61145839 A | 7/1986 |
| 2007/0032084 A1 | 2/2007 | Henley | | JP | 61160950 A | 7/1986 |
| 2007/0037323 A1 | 2/2007 | Henley et al. | | JP | 61208268 A | 9/1986 |
| 2007/0037363 A1 | 2/2007 | Aspar et al. | | JP | 62071215 A | 4/1987 |
| 2007/0051299 A1 | 3/2007 | Ong et al. | | JP | 62265728 A | 11/1987 |
| 2007/0072393 A1 | 3/2007 | Aspar et al. | | JP | 63056936 A | 3/1988 |
| 2007/0087531 A1 | 4/2007 | Kirk et al. | | JP | 63065648 A | 3/1988 |
| 2007/0093039 A1 | 4/2007 | Kerdiles et al. | | JP | 63111652 A | 5/1988 |
| 2007/0117229 A1 | 5/2007 | Schwarzenbach et al. | | JP | 63126245 A | 5/1988 |
| 2007/0119893 A1 | 5/2007 | Rayssac et al. | | JP | 63155731 A | 6/1988 |
| 2007/0122926 A1 | 5/2007 | Martinez et al. | | JP | 6412544 A | 1/1989 |
| 2007/0122995 A1 | 5/2007 | Henley et al. | | JP | 1196873 A | 8/1989 |
| 2007/0122997 A1 | 5/2007 | Henley et al. | | JP | 1220458 | 9/1989 |
| 2007/0123013 A1 | 5/2007 | Henley et al. | | JP | 1226167 A | 9/1989 |
| 2007/0148911 A1 | 6/2007 | Chang et al. | | JP | 1226168 A | 9/1989 |
| 2007/0190737 A1 | 8/2007 | Morimoto et al. | | JP | 244749 A | 2/1990 |
| 2007/0200144 A1 | 8/2007 | Aspar et al. | | JP | 267746 A | 3/1990 |
| 2007/0231932 A1 | 10/2007 | Reynaud et al. | | JP | 2194520 | 8/1990 |
| 2007/0232022 A1 | 10/2007 | Henley et al. | | JP | 3016787 A | 1/1991 |
| 2007/0232025 A1 | 10/2007 | Moriceau et al. | | JP | 3091227 A | 4/1991 |
| 2007/0235074 A1 | 10/2007 | Henley et al. | | JP | 3108776 A | 5/1991 |
| 2007/0259526 A1 | 11/2007 | Kang et al. | | JP | 3132055 A | 6/1991 |
| 2007/0296035 A1 | 12/2007 | George et al. | | JP | 3183130 | 8/1991 |
| 2008/0006909 A1 | 1/2008 | Maleville | | JP | 3270220 | 12/1991 |
| 2008/0014713 A1 | 1/2008 | Neyret et al. | | JP | 4162630 A | 6/1992 |
| 2008/0014718 A1 | 1/2008 | Neyret et al. | | JP | 4304653 | 10/1992 |
| 2008/0036039 A1 | 2/2008 | Aspar | | JP | 5090117 | 4/1993 |
| 2008/0038901 A1 | 2/2008 | Henley et al. | | JP | 5152181 | 6/1993 |
| 2008/0038908 A1 | 2/2008 | Henley | | JP | 7263290 A | 10/1995 |
| 2008/0057675 A1 | 3/2008 | Henley et al. | | JP | 7320996 A | 12/1995 |
| 2008/0063872 A1 | 3/2008 | Coletti et al. | | JP | 8097110 A | 4/1996 |
| 2008/0124895 A1 | 5/2008 | Lo et al. | | JP | 9293845 A | 11/1997 |
| 2008/0128868 A1 | 6/2008 | Aspar | | JP | 11067701 | 3/1999 |
| 2008/0223285 A1* | 9/2008 | Lee ................................. 117/2 | | JP | 11219872 | 8/1999 |
| | | | | JP | 11274442 | 10/1999 |

FOREIGN PATENT DOCUMENTS

| | | | | | | |
|---|---|---|---|---|---|---|
| | | | | JP | 2000121468 A | 4/2000 |
| EP | 0060103 A1 | 9/1982 | | JP | 2001093887 A | 4/2001 |
| EP | 0168815 A2 | 1/1986 | | JP | 20021974 A | 1/2002 |
| EP | 0171186 A1 | 2/1986 | | JP | 2004331731 A | 11/2004 |
| EP | 0238066 A2 | 9/1987 | | JP | 200667746 A | 3/2006 |
| EP | 0327316 A2 | 8/1989 | | WO | WO-8804829 A1 | 6/1988 |
| EP | 0366208 A2 | 5/1990 | | WO | WO-9520824 A1 | 8/1995 |
| EP | 0441270 A2 | 8/1991 | | WO | WO-9820543 A2 | 5/1998 |
| EP | 434984 | 9/1991 | | WO | WO-9833209 A1 | 7/1998 |
| EP | 0293459 B1 | 7/1992 | | WO | WO-9835248 A1 | 8/1998 |
| EP | 504714 | 9/1992 | | WO | WO-9905711 A1 | 2/1999 |
| EP | 533551 | 3/1993 | | WO | WO-9908316 A1 | 2/1999 |
| EP | 0603849 A2 | 6/1994 | | WO | WO-9935674 A1 | 7/1999 |
| EP | 660140 | 6/1995 | | WO | WO-9939377 A1 | 8/1999 |
| EP | 664557 | 7/1995 | | WO | WO-9966559 A1 | 12/1999 |
| EP | 0665588 A1 | 8/1995 | | WO | WO-0003429 A1 | 1/2000 |
| EP | 703609 | 3/1996 | | WO | WO-0024054 A1 | 4/2000 |
| EP | 793263 | 9/1997 | | WO | WO-0024059 A1 | 4/2000 |
| EP | 926706 | 6/1999 | | WO | WO-0046847 A1 | 8/2000 |
| EP | 0938129 A1 | 8/1999 | | WO | WO-0048238 A1 | 8/2000 |
| EP | 1030196 A1 | 8/2000 | | WO | WO-0075968 A1 | 12/2000 |
| EP | 1045448 A1 | 10/2000 | | WO | WO-0075995 A1 | 12/2000 |
| EP | 1085352 A2 | 3/2001 | | WO | WO-0103171 A1 | 1/2001 |
| EP | 1130647 A2 | 9/2001 | | WO | WO-0103172 A1 | 1/2001 |
| FR | 2681472 | 3/1993 | | WO | WO-0129890 A2 | 4/2001 |
| FR | 2725074 | 3/1996 | | WO | WO-02097982 A1 | 12/2002 |
| FR | 2758907 | 7/1998 | | WO | WO-2010091200 A2 | 8/2010 |
| FR | 2771852 | 6/1999 | | | | |
| GB | 575923 A | 3/1946 | | | | |
| GB | 2053026 A | 2/1981 | | | OTHER PUBLICATIONS | |
| GB | 2122420 A | 1/1984 | | | | |
| GB | 2211991 | 7/1989 | | | | |
| JP | 53104156 A | 9/1978 | | | | |
| JP | 54013273 A | 1/1979 | | | | |
| JP | 54152464 | 11/1979 | | | | |

"International Application Serial No. PCT/US2010/023230, Search Report mailed Sep. 27, 2010", 9 pgs.

"International Application Serial No. PCT/US2010/023230, Written Opinion mailed Sep. 27, 2010", 4 pgs.

Black, R. D., et al., "Silicon and Silicon Dioxide Thermal Bonding for Silicon-Insulator Applications", Journal of Applied Physics, 63(8), (Apr. 15, 1988), 2773-2777.

Davis, Robert F., et al., "Thin film deposition and microelectronic and optoelectronic device fabrication and characterization in monocrystalline alpha and beta silicon carbide", Proceedings of the IEEE, 79(5), (May 1991), 677-701.

Furukawa, K., et al., "Insulated-gate and junction-gate FET's of CVD-Grown beta-SiC", IEEE Electron Device Letters, 8(2), (Feb. 1987), 48-49.

Gotou, Hiroshi, et al., "SOI-Device on Bonded Wafer", Fujitsu Sci. Tech. J., 24(4), (Dec. 1988), 408-417.

Harisma, J., et al., "Silicon-on-Insulator Wafer Bonding-Wafer Thinning Technological Evaluations", Japanese Journal of Applied Physics, 28(8), (Aug. 1989), 1426-1443.

Hayashi, Y., et al., "Fabrication of three-dimensional IC using 'cumulatively bonded IC'(CUBIC) technology", Symposium on VLSI Technology, 1990. Digest of Technical Papers., (1990), 95-96.

Hirata, M., et al., "Silicon diaphragm pressure sensors fabricated by anodic oxidation etch-stop", Sensors and Actuators, 13(1), (Jan. 1988), 63-70.

Imai, K., "A new thinning method for obtaining less than 100-nm-thick Si film on wafer bonding", Japanese J. of Appl. Phys. 30(6), (Jun. 1991), 1154-1157.

Ismail, M. S, et al., "Silicon nitride direct bonding", IEEE Electric Letters, 26(14), (1990), 1045-1046.

Ismail, M. S, et al., "Technological considerations of three-dimensional CMOS inverter formed with alighned wafter bonding", J. Electrochem. Soc., 138(8), Abstract 503, (1991), 404C.

Lasky, J B, et al., "Silicon-on-insulator (SOI) by bonding and ETCH-back", IEEE 1985 International Electron Devices Meeting, vol. 31, (1985), 684-687.

Lasky, J. B., "Wafer Bonding for Silicon-on-Insulator Technologies", Applied Physics Letters, 48(1), (Jan. 6, 1986), 78-80.

Lehman, V., et al., "Contamination Protection of Semiconductor Surfaces by Wafer Bonding", Solid State Technology, (Apr. 1, 1990), 91-92.

Little, M. J, et al., "The 3-D Computer", 1st International Conference on Wafer Scale Integration, Proceedings., (1989), 55-64.

Matsushita, T., et al., "High-quality thin-film SOI technology using wafer bonding and selective polishing for VLSIs", IEEE Transactions on Electron Devices, 36(11), (Nov. 1989), 2621.

Palmour, J. W., et al., "Characterization of Device Parameters in High-Temperature Metal-Oxide-Semiconductor field-effect transistors in .beta.-SiC Thin Films", J. Appl. Phys. 64(4), (Apr. 26, 1988), 2168-2177.

Pastor, K., et al., "Silicon Nitride as a dielectric for low temperature direct wafer bonding", J. Electrochem. Soc., 138(8), Abstract 468, (1991), 402C.

Petersen, K, et al., "Silicon Fusion Bonding for Pressure Sensors", Technical Digest., IEEE Solid-State Sensor and Actuator Workshop, 1988., (Jun. 1988), 144-147.

Shibahara, K., et al., "Inversion-Type N-Channel MOSFET Using Antiphase-Domain Free Cubic-SiC Grown on Si(100)", 1986 International) Conference on Solid State Device and Materials, Tokyo, (1986), 717-720.

Shimbo, M., et al., "Silicon-to-Silicon direct bonding method", J. Appl. Phys. vol. 60, No. 8, (Oct. 1986), 2987-2989.

Smith, R. L, et al., "A wafer-to-wafer alignment technique", Sensors and Actuators, 20(3), (Dec. 1, 1989), 315-316.

Smith, R. L, et al., "Micromachined packaging for chemical microsensors", IEEE Transactions on Electron Devices, 35(6), (Jun. 1988), 787-792.

Smith, R. L, et al., "The design and fabrication of a magnetically actuated micromachined flow valve", Sensors and Actuators A: Physical, 24(1), (May 1990), 47-53.

Stemme, G., "A CMOS integrated silicon gas-flow sensor with pulse-modulated output", Sensors and Actuators, 14(3), (Jul. 1988), 293-303.

Stengl, R., et al., "A Model for the Silicon Wafer Bonding Process", Japanese Journal of Applied Physics, 28, (1989), 1735-1741.

Tenrez, L., et al., "Silicon microcavities fabricated with a new technique", IEEE Electronic Letters, 22(11), (1986), 615-616.

Whitton, J L, et al., "The collection of ions implanted in semiconductors. I. saturation effects", Radiation Effects, 16(1-2), (Sep. 1972), 107-114.

Yasumoto, M., et al., "Promising new fabrication process developed for stacked LSrs", Technical. Digest in IEEE Int. Electron Devices Mtg., IEDM 84, (1984), 816-819.

US 6,391,219, 05/2002, Kang et al. (withdrawn)

* cited by examiner

SEMICONDUCTOR MATERIAL MANUFACTURE

PRIORITY APPLICATION

This application is a divisional of U.S. application Ser. No. 12/365,734, filed Feb. 4, 2009, now U.S. Pat. No. 7,927,975, which is incorporated herein by reference in its entirety.

BACKGROUND

Power consumption during operation of a silicon microchip can be reduced using silicon on insulator (SOI) technology. The use of SOI technology can not only result in lower power consumption but also in an increased speed of operation of integrated circuits due to a reduction in stray capacitance. For SOI structures, thin layers of silicon on insulator can be fabricated using several well known techniques such as separation by implantation of oxygen (SIMOX), separation by plasma implantation of oxygen (SPIMOX), silicon on sapphire (SOS), bonded wafer processes on silicon, and silicon bonded on sapphire.

Bonded wafer processes on silicon involve technologies to bond monocrystalline silicon materials onto semiconductor wafers and oxidation processes to form the semiconductor on insulator. In these technologies, a portion of one or both of the bonded wafers is removed, typically, by polishing methods. Another process to remove large portions of a bonded wafer uses a "smart cut" technology. "Smart cut" technology generally refers to a process in which a material is implanted into a silicon substrate to a particular depth and ultimately utilized to crack the substrate.

DETAILED DESCRIPTION

The following detailed description refers to the accompanying drawings that show, by way of illustration, various embodiments of the invention. These embodiments are described in sufficient detail to enable those skilled in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, a fabrication process includes bonding two wafers together and then disuniting the two wafers leaving a portion of one wafer bonded to the other wafer, where exposure to electromagnetic radiation is used to facilitate the separation. By the disunite of two entities A and B that are bonded together, it is meant that the entities A and B are no longer bonded at the region of disunion, that is, covalent bonds are broken in the lattice of A and B that are bonded together. Disuniting may also be referred to as debonding. After disuniting, weak attractive forces between the two debonded entities may or may not still be in effect. The portion of the one wafer that remains bonded with the other wafer can be a semiconductor layer or a combination of a semiconductor layer on a dielectric layer. Exposure to electromagnetic radiation can include tuning the electromagnetic radiation to a frequency based on modifiers in the wafers. The electromagnetic radiation can also be tuned to a power level based on the modifiers in the wafers.

A modifier in a material structure, such as a wafer, is a material in the material structure whose composition is different from material that forms the bulk of the material structure. For example, a modifier in a germanium wafer can be an element that is different from germanium and is not part of the lattice of the germanium wafer. A modifier in a material structure, such as a wafer, can be an impurity of the material structure such that the modifier is an atomic species that is different from the bulk material of the material structure. In various embodiments, a modifier can be material introduced into the material structure to be used as a dopant. A dopant, herein, is a material different from the bulk material in a material structure, where the dopant, once activated, provides an enhancement to a characteristic of the bulk material. For example, a dopant can provide an increase in carrier concentration in a semiconductor material matrix. In various embodiments, a modifier can be an activated dopant.

In various embodiments, a fabrication process includes exposing a wafer to electromagnetic radiation to activate modifiers as dopants in the wafer, where the wafer includes a portion of material donated from another wafer. Activation of a dopant comprises transferring the dopant from an interstitial position in a material structure into a lattice site of the material structure. The portion of material donated from another wafer can be a semiconductor layer or a combination of a semiconductor layer on a dielectric layer. Exposure to electromagnetic radiation can include tuning the electromagnetic radiation to a frequency based on the dopants in the wafer. The electromagnetic radiation can also be tuned to a power level based on the dopants in the wafers.

Figure 1:
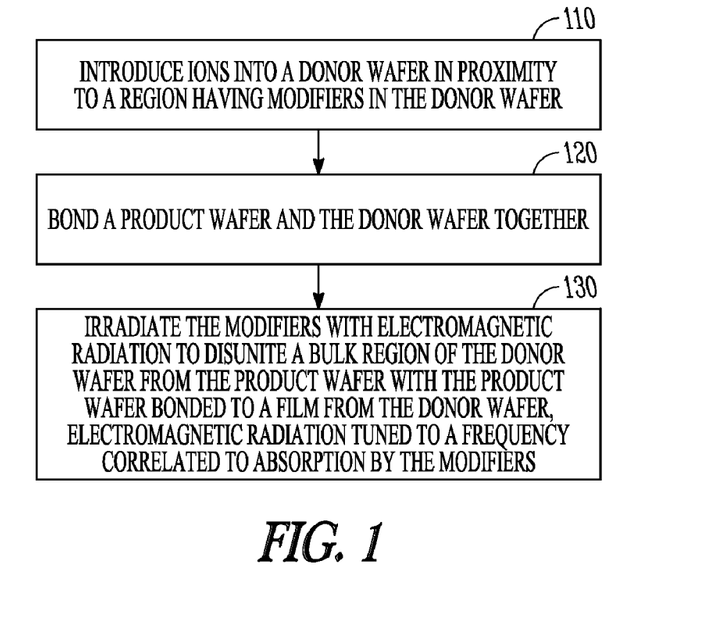
FIG. 1 shows features of a method for forming a film on a wafer using electromagnetic radiation, according to various embodiments of the invention.

FIG. 1 shows features of a method for forming a film on a wafer using electromagnetic radiation, according to various embodiments. At 110, ions are introduced into a donor wafer in proximity to a region of the donor wafer. The region includes or will include modifiers that are of material or materials that are different from bulk material of the donor wafer. The region is at a distance from a surface of the donor wafer. The term "donor wafer" indicates at least of portion of the wafer is to be used by another entity, such as another wafer or a substrate with devices formed therein. In various embodiments, a semiconductor wafer can be used as a donor wafer. The semiconductor wafer can be realized as an essentially monocrystalline wafer. Depending on the application, the donor wafer can be in the form of a semiconductor wafer that is substantially polycrystalline or amorphous, where the semiconductor wafer includes a semiconductor material that is single crystalline and is arranged as a top layer across the semiconductor wafer. Alternatively, the donor wafer may be constructed as a substantially non-semiconductor wafer that includes a semiconductor layer, which may be configured as a single crystal that is arranged as a top layer across the non-semiconductor wafer.

At 120, a product wafer and the donor wafer are bonded together at the surfaces of the donor wafer and the product wafer. The term "product wafer" indicates that the wafer or at least of portion of the wafer is to be used as or in a final product. A completed product wafer may be provided as a wafer arranged with a plurality of segments, where each segment includes circuitry to perform electronic tasks. Each segment can be in the form of an individual die. Additionally, individual segments can be from a completed wafer and can be packaged as integrated circuits (ICs) for use in electronic apparatus.

The product wafer and the donor wafer can be bonded to together using a number of individual processes or combinations of processes. The process can be conducted by bonding the product wafer to the donor wafer. The process can be conducted by bonding the donor wafer to the product wafer. The product wafer and the donor wafer may be bonded together with the product wafer disposed on the donor wafer or with the donor wafer disposed on the product wafer. The product wafer may have undergone some processing before bonding to the donor wafer. The processing can include various types of processing. The product wafer can contain devices and/or interconnections formed within the product wafer prior to bonding to the donor wafer. Alternatively, the product wafer can be bonded to the donor wafer without forming devices and/or interconnections within the product wafer prior to bonding to the donor wafer. Additionally, the donor wafer may have undergone some processing before bonding with the product wafer. The processing can include various types of processing. The donor wafer can contain devices and/or interconnections formed within the donor wafer prior to bonding with the product wafer, where the devices and/or interconnections are in a region of the donor wafer that is to be donated as material to the product wafer. Alternatively, the donor wafer can be bonded with the product wafer without forming devices and/or interconnections within the donor wafer prior to bonding with the product wafer.

In various embodiments, the product wafer can include a dielectric layer disposed across the surface of the product wafer such that the product wafer and the donor wafer are bonded together at the dielectric layer. The dielectric layer of the product wafer, at which the donor wafer contacts the product layer during bonding, may be realized in various forms. For example, the dielectric layer may be formed as an oxide layer, a layer of native oxide of the underling product wafer, an insulating nitride layer, an insulating oxynitride layer, a high-κ dielectric layer, a low-κ dielectric layer, or combinations thereof. High-κ dielectric and low-κ dielectric are defined referenced to dielectric constants being above or below, respectively, the dielectric constant of silicon dioxide, which is approximately 3.9. The selection of dielectric material to which the donor wafer is bonded may depend on the application or applications to which the product wafer may be used. In various embodiments, the dielectric layer of the product wafer is a top layer of a product wafer, where the product wafer includes devices embedded in the product wafer below this dielectric top layer prior to bonding the product wafer and the donor wafer together.

In various embodiments, the donor wafer can include a dielectric layer disposed across the surface of the donor wafer such that the donor wafer and the product wafer are bonded together at the dielectric layer. The dielectric layer of the donor wafer at which the product wafer contacts the donor layer during bonding may be realized in various forms. For example, the dielectric layer may be formed as an oxide layer, a layer of native oxide of the underling product wafer, an insulating nitride layer, an insulating oxynitride layer, a high-κ dielectric layer, a low-κ dielectric layer, or combinations thereof. The selection of dielectric material to which the product wafer is bonded may depend on the application or applications to which the product wafer may be used.

With a dielectric material formed as a layer across a top surface of the donor wafer, ions introduced into the donor wafer are in proximity to a region of the donor wafer that is some distance from a bottom surface of the dielectric layer. The bottom surface of the dielectric layer is a surface that is opposite the top of the donor wafer, where the top and bottom surface of the dielectric layer are spaced apart by the thickness of the dielectric layer. In such embodiments, the donor wafer is used to donate material that includes a semiconductor layer and a dielectric layer with the dielectric layer disposed across a surface of the semiconductor layer. Optionally, the semiconductor layer of such a material combination may have undergone some type of processing before bonding. In various embodiments, such processing may include forming devices and/or interconnections.

At 130, the modifiers are irradiated with electromagnetic radiation to disunite a bulk region of the donor wafer from the product wafer with the product wafer bonded to a film from the donor wafer. The film from the donor wafer can be a semiconductor layer that is bonded to the product wafer. The film from the donor wafer can be a semiconductor layer that is bonded to a dielectric layer of the product wafer. The film from the donor wafer can be a combination of a semiconductor layer on a dielectric layer, where the dielectric layer of the combination is bonded to the product wafer.

Irradiating the modifiers can provide localized heating of the donor wafer such that bubbles grow at the material implanted as ions causing the disuniting of a bulk region of the donor wafer from the product wafer with the product wafer bonded to a film from the donor wafer. The electromagnetic radiation can be tuned to a frequency correlated to absorption by the modifiers. Tuning to a frequency includes generating the electromagnetic radiation with a peak frequency that is absorbed by the modifiers. The selection of the frequency of absorption by the modifiers may be correlated to the material in which the modifiers are disposed such that energy absorbed by the modifiers can be coupled to the material implanted as ions in the donor wafer. The power level of the electromagnetic radiation can be adjusted based on the application. The frequency and power level can be selected such that irradiation causes the bubbles to grow such as to coalesce across the bonded structure to provide the desired disunion. These bubbles can be viewed as voids or platelets.

Once the bulk region of the donor wafer is disunited from the product wafer, one of the two wafers can be separated from the other depending on the relative position of the wafers during processing, even though the film from the donor wafer remains bonded to the product wafer. The separation can be performed by a lifting process. The lifting of one wafer from the other may be accomplished using a vacuum or other controllable device essentially without exerting any substantial energy or force at the location at which the debonded wafers contact each other.

With the electromagnetic radiation provided at a frequency correlated to absorption by the modifiers, the combination of donor wafer and product wafer can be irradiated with electromagnetic radiation such that absorption of energy can be controlled. The electromagnetic radiation can be applied such that excitation of material is localized at or near the region in which the ions are implanted. At appropriate frequencies, absorption can be substantially directed to the modifiers that are at or sufficiently near the region of ion implantation in the donor wafer such that energy absorbed by the modifiers couples into the region of ion implantation. Coupling the energy into the region of ion implantation allows for localized heating of the donor wafer.

Conventional processing of films from donor wafers using material implanted as ions typically are performed at iso-thermal temperatures ranging from 500° C. to 800° C. or higher. In various embodiments, the combination of product wafer and donor wafer may be heated to iso-thermal temperatures less than or about equal to 350° C., depending on the materials used in the process. The localized heating allows for lower processing temperatures than is conventionally used in similar processes. Further, tuning the irradiated electromagnetic radiation allows for the control of the amount of energy that is imparted as to maintain the localized heating at the desired regions of heating. In tuning to a selected frequency and power level, the concentration of the modifiers to be used for the disunion can be taken into account in the overall selection of frequency and power for the disunion process for a particular material composition of the donor wafer.

Tuning the electromagnetic radiation may include generating the electromagnetic radiation at a power level that activates the irradiated modifiers as dopants in the donor wafer. Activation of a dopant comprises transferring the dopant from an interstitial position in a material structure into a lattice site of the material structure. Activating the dopants in the regions near the material implanted as ions, using the exposure to the electromagnetic radiation that provides the coupling of energy for disunion, allows for the activation of these dopants without processing the wafer structure that high temperatures conventionally associated with activating dopants. The radiation can also heal lattice damage from implantation.

Irradiation of the dopants with electromagnetic radiation may include limiting exposure of the electromagnetic radiation to the donor wafer. The electromagnetic radiation exposure can be provided by directing the electromagnetic radiation to the surface of the donor wafer that is opposite to the surface of the donor wafer at which the donor wafer is bonded to the product wafer. The electromagnetic radiation exposure can also be provided by directing the electromagnetic radiation to a side of the donor wafer that is at angle to the surface of the donor wafer that is bonded to the product wafer.

Tuning the electromagnetic radiation can be correlated to the basic composition of the donor wafer, the selection of the modifiers in the desired region of localized heating, the selection of the concentration of these modifiers, the mixture of the material implanted as ions and modifiers in the region, and other factors that impact localized absorption and coupling at the desired region. Such factors provide characteristic features to the donor wafer such that energy from exposure to electromagnetic radiation is preferentially coupled to the desired region. The frequency selected may be based on frequencies that are not substantially absorbed by the basic composition of the donor wafer but are significantly absorbed by the modifiers and/or mixture of modifiers and material implanted as ions for the disunion process. In various embodiments, the amount of absorption by the basic composition of the donor wafer and the amount of absorption by the modifiers and/or mixture of modifiers and material implanted as ions may be based on various factors including, but not limited to, the spatial amount of localized heating desired and the amount of heating of the combination of product and donor wafer that is acceptable for a particular application.

Coupling energy, provided from exposing the modifiers to electromagnetic energy, to the region of implanted ions allows bubbles to grow at the implanted ions. With the bubbles growing such that the bubbles coalesce across the donor wafer, a bulk region of the donor wafer disunites from the product wafer with a film of the donor wafer remaining bonded to the product wafer. With the product wafer, having the bonded film from the donor wafer, disunited from the donor wafer, the product wafer can be separated from the donor wafer. For example, the product wafer may be lifted from lying on the donor wafer. Alternatively, with the product wafer, having the bonded film from the donor wafer, disunited from the donor wafer, the donor wafer may be separated from the product wafer. For example, the donor wafer may be lifted from lying on the product wafer.

After separating the donor wafer and product wafer, surfaces of the product and donor wafers may optionally be processed to compensate for residual damage due to the separation process. After separating the donor wafer and product wafer, the product wafer can be provided as a final product that is used as input material for further processing, or it can be processed as a final product containing a plurality of processed dies or as a plurality of processed dies. After separating the donor wafer and product wafer, the donor wafer may be used to donate films to generate other product wafers.

Figure 2:
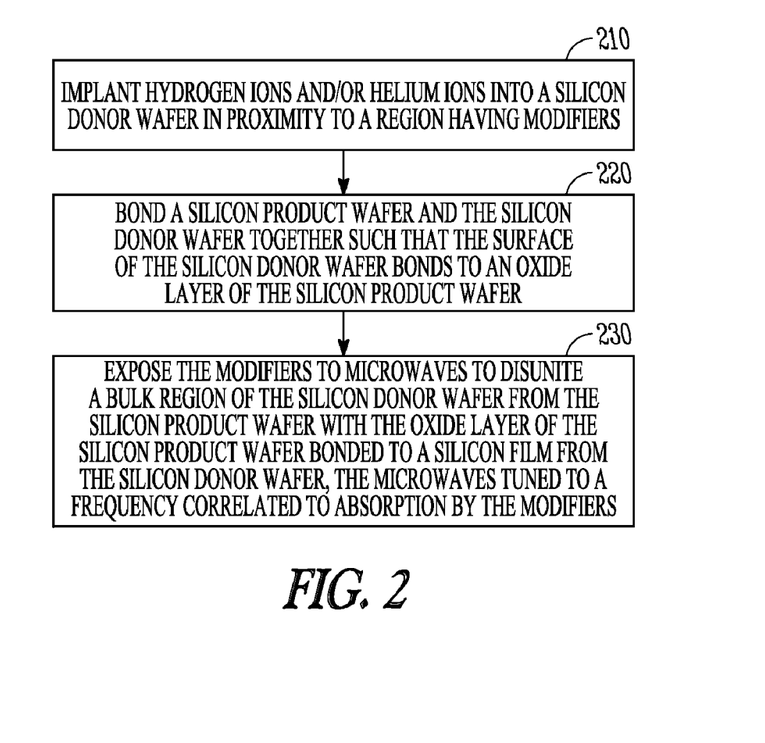
FIG. 2 shows features of a method for forming a silicon layer on a silicon wafer using microwaves, according to various embodiments of the invention.

FIG. 2 shows features of a method for forming a silicon layer on a silicon wafer using microwaves, according to various embodiments. At 210, hydrogen ions and/or helium ions are implanted into a silicon donor wafer in proximity to a region that has modifiers or will have modifiers introduced later in processing. Ions of other light weight elements may be used as the implanted ions. The region containing the modifiers is at a distance from a surface of the donor wafer. The modifiers may include, but are not limited to, such elements as phosphorous, arsenic, boron, other elements that may be used as dopants, and combinations of such dopants.

At 220, a silicon product wafer is bonded together with the silicon donor wafer such that an oxide layer of the silicon product wafer bonds to the surface of the silicon donor wafer. The process can be performed by bonding the product wafer to the donor wafer. The process can be performed by bonding the donor wafer to the product wafer. The product wafer and the donor wafer may be bonded together with the product wafer disposed on the donor wafer or with the donor wafer disposed on the product wafer. The oxide layer may be formed as an oxide of silicon, which may be formed as a native silicon oxide. Alternatively, a dielectric layer other than an oxide layer may be used. Such a dielectric layer may be formed as an insulating nitride layer, an insulating oxynitride layer, a high-κ dielectric layer, a low-κ dielectric layer, or combinations thereof. The selection of dielectric layer to which the silicon donor wafer is bonded may depend on the application or applications to which the silicon product wafer may be used. In various embodiments, the oxide layer, or other dielectric layer, of the silicon product wafer comprises a top layer of a silicon product wafer that includes devices embedded in the bulk silicon of the silicon product wafer prior to bonding the silicon product wafer and the silicon donor wafer together. Alternatively, a silicon product wafer without a surface oxide layer, or a surface dielectric layer, can be bonded together with the donor wafer such that silicon to silicon direct bonding is attained without an interstitial material.

At 230, the modifiers are exposed to microwaves to disunite a bulk region of the silicon donor wafer separating the donor wafer from the product wafer and leaving a portion of the donor wafer bonded to the oxide surface of the product wafer. The microwaves can be tuned to a frequency correlated to absorption by the modifiers. In this manner, the silicon donor wafer can be locally heated by the microwaves, at the region where the hydrogen ions and/or helium ions were implanted, such that bubbles at the hydrogen and/or helium grow to an extent resulting in the disunion. The power level of the microwaves can be adjusted based on the application. The microwaves may be tuned to a peak frequency ranging from 1.4 gigahertz to as high as 80 or 100 gigahertz. In various embodiments, a range from 2.4 to 8.5 gigahertz is used. In various embodiments, a range from 5.7 GHz to 6.0 GHz is used. In various embodiments, the microwaves are tuned to about 5.8 GHz. The power imparted by the microwaves can be controlled to regulate the localization of the heating. The exposure to microwaves may be conducted with the wafers at a general iso-thermal wafer temperature less than 350° C. The iso-thermal wafer temperature may be considered a reference temperature of the wafer, which is not the local temperature in the region of interest, where the electromagnetic radiation is absorbed and energy is transferred.

Tuning the microwaves may include providing the microwaves at a power level that activates modifiers as dopants in the silicon donor wafer. The power level of the microwaves can be controlled to regulate the temperature of the combination of the silicon product wafer and the silicon donor wafer such that activation of these dopants can be performed without processing the silicon product wafer/silicon donor structure at high temperatures conventionally associated with activating dopants. Tuning of the microwaves can be correlated to adjusting the material composition of the silicon donor wafer by selection of the dopants used for disunion and the concentration of these dopants. For example, a concentration of a dopant in a silicon dopant wafer can range from about $10^{13}$ cm$^{-3}$ to about $10^{16}$ cm$^{-3}$. Introducing these dopant-based changes to the region of the silicon donor wafer allows for preferential absorption from the tuning the frequency of the microwaves and for coupling energy from the microwave absorption to the region of implanted ions for disunion.

Figure 3:
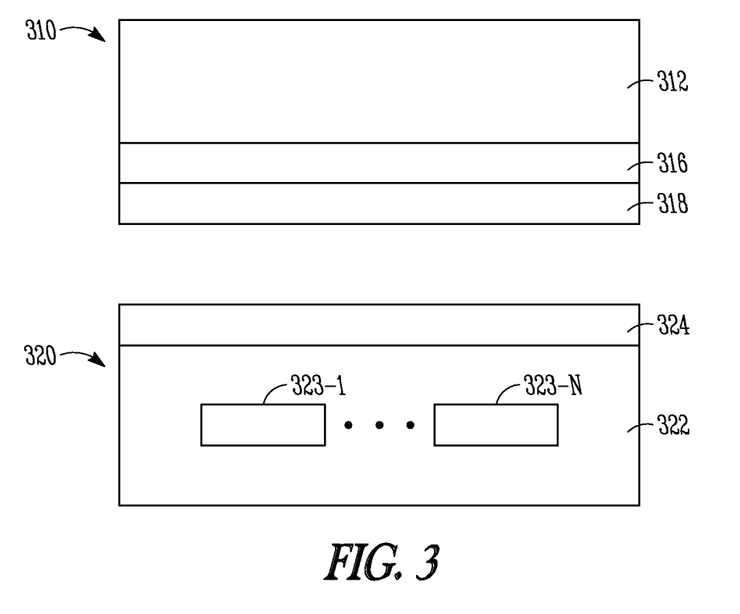
FIGS. 3-4 illustrate product wafers and donor wafers prior to bonding these wafers together as discussed, for example, with respect to FIGS. 1-2, according to various embodiments of the invention.
Figure 4:
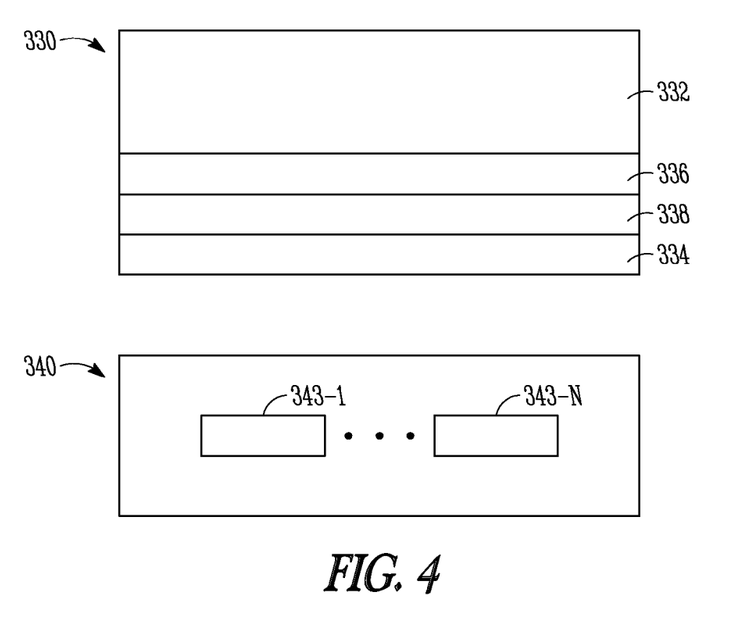

FIGS. 3-4 illustrate product wafers and donor wafers prior to bonding these wafers together in various embodiments as discussed, for example, with respect to FIGS. 1-2. FIG. 3 shows a product wafer 320 and a donor wafer 310. Product wafer 320 may optionally have a dielectric layer 324 as a top layer on a bulk region 322, where the dielectric layer 324 can be bonded with donor wafer 310. Additionally, product wafer 320 can optionally have devices and/or interconnections 323-1 . . . 323-N formed in product wafer 320 before being bonded to donor wafer 310. Donor wafer 310 includes a region 316 in which ions are implanted. Region 316 separates a bulk region 312 of donor wafer 310 from a layer 318. Layer 318 from donor wafer 310 will provide a relatively thin film layer to product wafer 320 at the conclusion of the process of forming a thin layer on and substantially across product wafer 320.

FIG. 4 shows a configuration of a product wafer 340 and a donor wafer 330 prior to bonding. Product wafer 340 can optionally have devices and/or interconnections 343-1 . . . 343-N formed in product wafer 340 before being bonded to donor wafer 330. In this configuration, donor wafer 330 includes a dielectric layer 334 rather than configuring a dielectric layer on a product wafer as an embodiment as shown in FIG. 3. Dielectric layer 334 is separated from a region 336, in which ions are implanted, by layer 338. Region 336 separates the combination of layer 338 and dielectric layer 334 from bulk region 332. Donor wafer 330 will be bonded to product wafer 340 with the bonding of dielectric layer 334 to product wafer 340. Alternatively, both product wafer 340 and donor wafer 330 can each include a dielectric layer at which product wafer 340 and donor wafer 330 are bonded together. Such dielectric layers can be composed of the same elemental composition or the dielectric layers can be formed of dielectric compositions having different elements.

Figure 5:
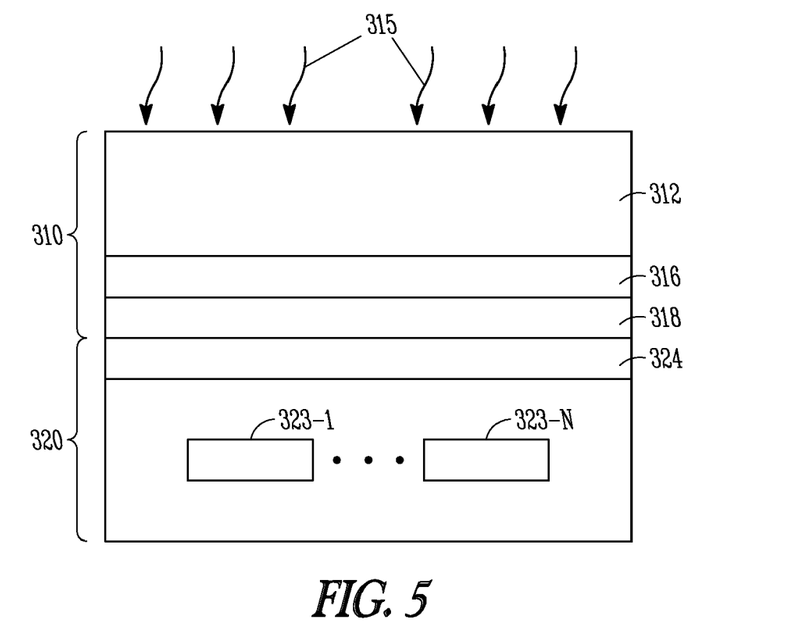
FIGS. 5-6 illustrate product wafers and donor wafers bonded together with electromagnetic radiation applied to the combination as discussed, for example, with respect to FIGS. 1-2, according to various embodiments of the invention.
Figure 6:
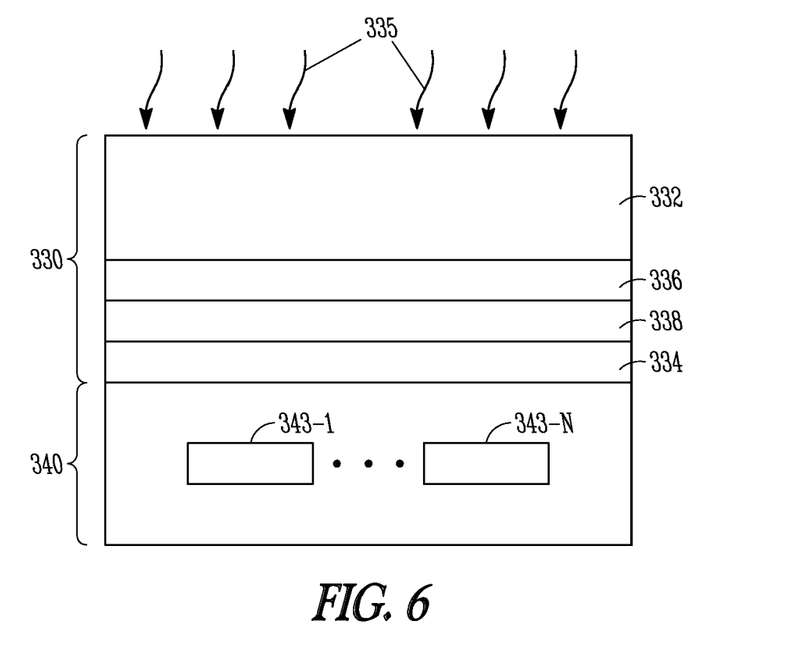

FIGS. 5-6 illustrate product wafers and donor wafers bonded together with electromagnetic radiation applied to the combination in various embodiments as discussed, for example, with respect to FIGS. 1-2. FIG. 5 shows product wafer 320 and donor wafer 310 of FIG. 3 bonded together with electromagnetic radiation 315 applied. FIG. 6 shows product wafer 340 and donor wafer 330 of FIG. 4 bonded together with electromagnetic radiation 335 applied. FIGS. 5 and 6 show electromagnetic radiation 315 and 335, respectively, applied at a surface of the donor wafer opposite the surface of donor wafers 310 and 330 that bond to product wafers 320 and 340, respectively. Alternatively, the radiation may be applied by focusing the radiation in the vicinity of layer 316 around the combined structure or at the surface of product wafers 320 and 340 opposite the surface of product wafers 320 and 340 that bond to donor wafers 310 and 330, respectively, depending on the structure in the bulk of product wafers 320 and 340.

Figure 7:
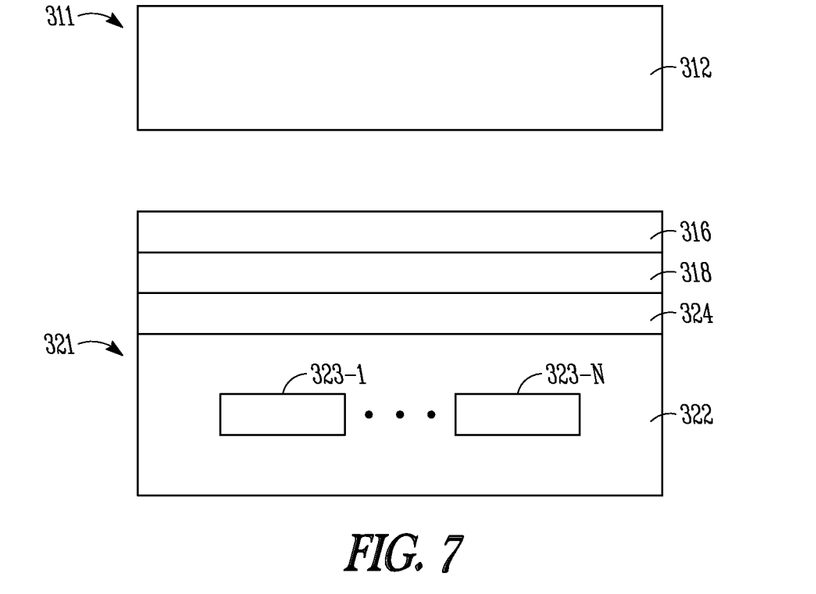
FIGS. 7-8 illustrate product wafers and donor wafers after disuniting these wafers bonded together as discussed, for example, with respect to FIGS. 1-2, according to various embodiments of the invention
Figure 8:
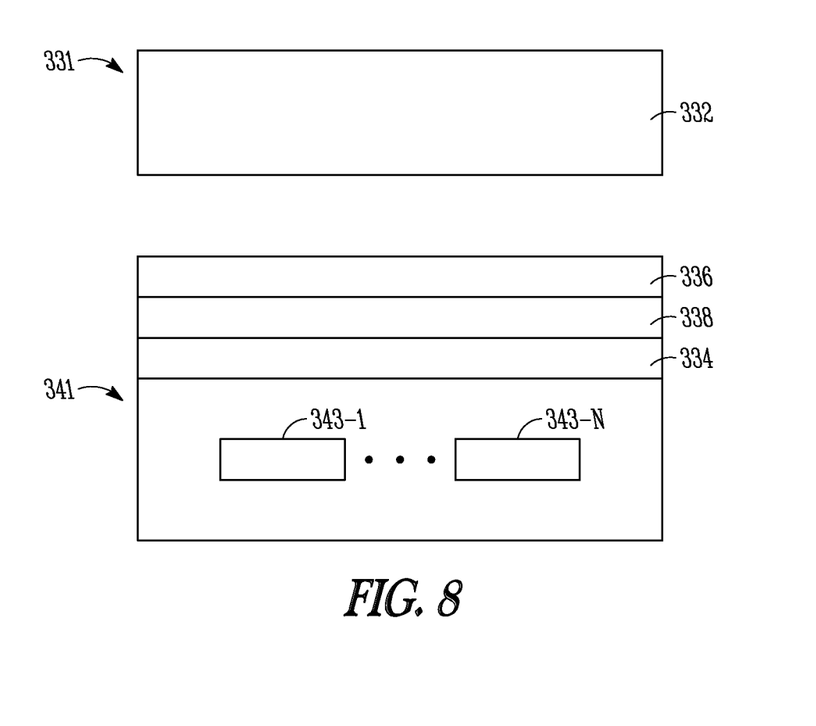

FIGS. 7-8 illustrate product wafers and donor wafers after disuniting these wafers bonded together in various embodiments as discussed, for example, with respect to FIGS. 1-2. FIG. 7 shows donor wafer 311 lifted from product wafer 321 after these wafers are disunited from being bonded together as shown in FIG. 5. Donor wafer 311 is donor wafer 310 modified by the process of donating a layer to product wafer 320. Donor wafer 311 is now available to donate another film onto another product wafer. Similarly, product wafer 321 is product wafer 320 modified by the process of acquiring a layer from donor wafer 310. Product wafer 321 is now available as a final product wafer or for further processing, which may include generating a number of processed dies.

FIG. 8 shows donor wafer 331 lifted from product wafer 341 after these wafers are disunited from being bonded together as shown in FIG. 6. Donor wafer 331 is donor wafer 330 modified by the process of donating a layer to product wafer 340. Donor wafer 331 is now available to donate another film onto another product wafer. Similarly, product wafer 341 is product wafer 340 modified by the process of acquiring a layer from donor wafer 330. Product wafer 341 is now available as a final product wafer or for further processing, which may include generating a number of processed dies.

Figure 9:
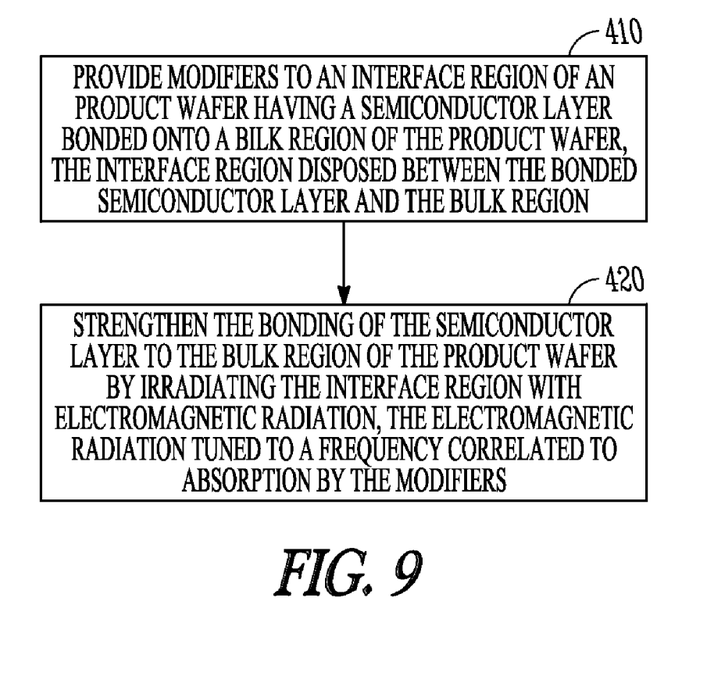
FIG. 9 shows features of a method for strengthening the bonding of a semiconductor layer to a wafer, according to various embodiments of the invention.

FIG. 9 shows features of a method for strengthening the bonding of a semiconductor layer to a wafer, according to various embodiments. At 410, modifiers are provided to an interface region of a product wafer having a semiconductor layer bonded onto a bulk region of the product wafer, where the interface region is disposed between the bonded semiconductor layer and the bulk region a product wafer. Various processes may have been used to construct the product wafer having the semiconductor layer bonded on the bulk region of the product wafer.

For example, such a product wafer configuration can be constructed from generating the semiconductor layer from a donor wafer. The donation process of the semiconductor layer can include bonding the donor wafer to the product wafer at a surface of the donor wafer, implanting ions into a region of the donor wafer at a distance from the surface, and imparting energy to the material implanted as ions to disunite the donor wafer from the product wafer with the semiconductor layer remaining bonded to the product wafer. The imparted energy at the material implanted as ions to disunite the bonded product and donor wafers can be provided by heating the bonded combination of wafers. The imparted energy to disunite the bonded product and donor wafers at the region of ion implantation can also be provided from applying a force at the implanted ions to cause a fracture across the combination in a direction substantially parallel with the bonded surfaces of the wafers. The imparted energy at the region of ion implantation to disunite the bonded product and donor wafers can be provided by irradiating modifiers with electromagnetic radiation in proximity of the material implanted as ions, in accordance with various embodiments, for example, as discussed with respect to FIGS. 1-8. Energy can be coupled from irradiation of the modifiers to the region of ion implantation. With the irradiation provided by electromagnetic radiation tuned to a frequency and power correlated with properties of the modifiers in the material matrix of the donor wafer, the energy imparted by the electromagnetic radiation provides for localized heating at the region of ion implantation.

In various embodiments in which a bonded semiconductor layer is generated from a donor wafer, the modifiers may be formed in the donor wafer prior to bonding to the product wafer. Alternatively, the modifiers may be formed after bonding the donor wafer and the product wafer together, either before or after disuniting the donor wafer from the product wafer. The modifiers used to facilitate strengthening of the bonding of the semiconductor layer to the product wafer can be of the same composition of elements that is used to disunite the donor wafer, which donates the semiconductor layer, from the product wafer to which the donated semiconductor layer is bonded. Alternatively, the modifiers used to facilitate strengthening of the bonding of the semiconductor layer to the product wafer can be of a different composition of elements that is used to disunite a donor wafer from the product wafer to which the donated semiconductor layer is bonded. The selection of modifiers and concentrations of the modifiers can depend on the material composition of the bonded semiconductor layer and the material composition of the bulk region of the product wafer. The selection of modifiers and concentrations of the modifiers may also depend on the material composition of a dielectric region that may be disposed between the bulk region and the bonded semiconductor layer in various embodiments.

At 420, the bonding of the semiconductor layer to the bulk region of the product wafer is strengthened by irradiating the interface region with electromagnetic radiation. The electromagnetic radiation can be tuned to a frequency correlated to absorption by the modifiers. The power level of the electromagnetic radiation can be adjusted based on the application to couple energy to the interface region. The selection of the frequency and power level can be correlated to the selection of modifiers and their concentrations with respect to the material composition of the bonded semiconductor layer and the material composition of the bulk region of the product wafer. The selection of the frequency and power level may also be correlated to the material composition of a dielectric region that may be disposed between the bulk region and the bonded semiconductor layer in various embodiments.

Figure 10:
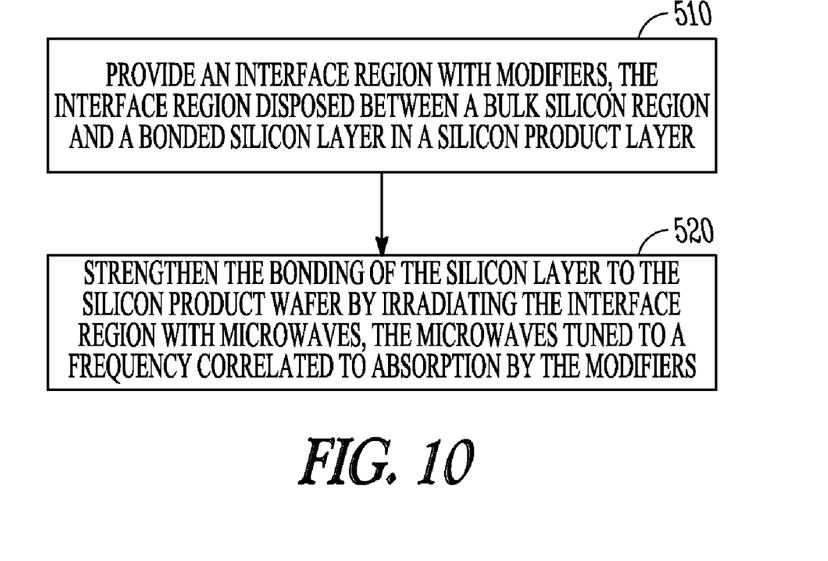
FIG. 10 shows features of a method for strengthening the bonding of a silicon layer to a silicon wafer, according to various embodiments of the invention.

FIG. 10 shows features of a method for strengthening the bonding of a silicon layer to a silicon wafer, according to various embodiments. At 510, an interface region in a silicon product wafer, having a silicon layer bonded onto the silicon product wafer, is provided with modifiers, where the interface region is disposed in the product silicon wafer between a bulk silicon region and the bonded silicon layer. The silicon layer may be formed from a silicon donor wafer by bonding the silicon donor wafer to the silicon product wafer at a surface of the silicon donor wafer, implanting hydrogen and/or helium ions into a region of the silicon donor wafer at a distance from the surface, and imparting energy to the implanted hydrogen and/or helium to disunite the silicon donor wafer from the product wafer with the silicon layer bonded to the silicon product wafer. The hydrogen and/or helium ions can be implanted into the silicon donor wafer before bonding together with the silicon product wafer. In various embodiments, an oxide layer, to which the bonded silicon layer is attached, is disposed on the bulk silicon region of the silicon product wafer with the oxide layer contacting the interface region. Furthermore, the silicon product wafer optionally can include devices constructed therein prior to forming the bonded silicon layer. In various embodiments, the imparted energy to disunite the silicon donor wafer from the product silicon wafer with the silicon layer bonded to the product wafer can be generated by irradiating modifiers within the donor wafer with microwaves. Absorption of the microwaves couples energy to the region of ion implantation to disunite the wafers. Activation energy in the doped region can be provided in such a manner that is equivalent to heating the bulk structure to 500° C. or greater to disunite the wafers.

The modifiers in the interface region can include such elements as phosphorous, arsenic, boron, other elements that may be used as dopants in silicon, and combinations of such dopants. The concentration of a dopant in the interface region can range from about $10^{13}$ cm$^{-3}$ to about $10^{16}$ cm$^{-3}$. Other concentrations of dopants can be used depending on the desired doping profile for the completed product wafer.

At 520, the bonding of the silicon layer to the silicon product wafer is strengthened by irradiating the interface region with microwaves. The microwaves can be tuned to a frequency correlated to absorption by the modifiers in the interface region. The power level of the microwaves can be adjusted based on the application to couple energy to the interface region. The frequency and power of the microwave energy can be tuned in correlation with the elemental composition of modifiers in the silicon product wafer and with the concentrations of such modifiers. Additionally, the interface region can be irradiated with microwaves at a power level to activate modifiers as dopants in the silicon matrix. The energy coupled by the microwaves can be targeted to an activation energy equivalent to 800° C. or greater bulk temperature to strengthen silicon to oxide bonding. The energy coupled by the microwaves can be targeted to an activation energy equivalent to 1000° C. or greater bulk temperature to strengthen direct silicon to silicon bonding. Coupling by microwaves provides bonding strengthening energy without the subjecting devices in the product silicon wafer to these equivalent temperatures. The interface region in the silicon structure can be exposed to microwaves having a peak frequency in the range from 5.7 GHz to 6.0 GHz.

Figure 11:
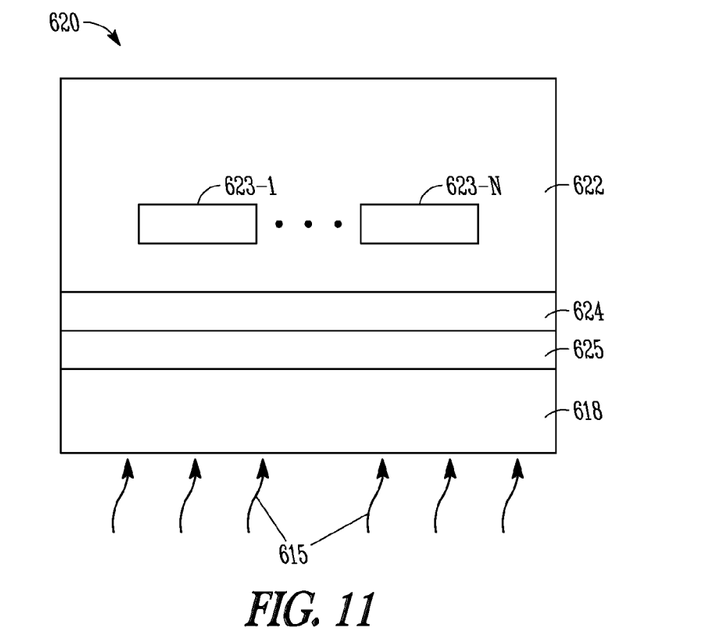
FIGS. 11-12 illustrate product wafers having a semiconductor layer bonded thereon being subjected to electromagnetic radiation to strengthen the bonding of the semiconductor layer to the product wafer, according to various embodiments of the invention.
Figure 12:
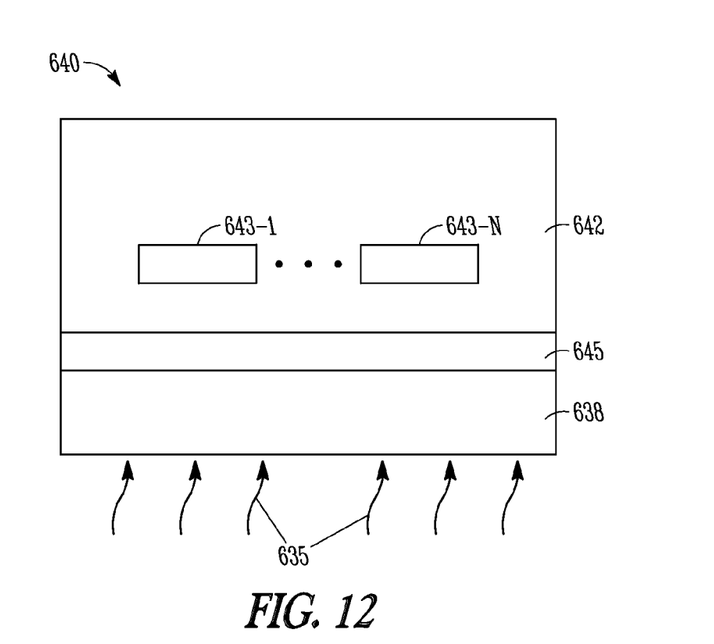

FIGS. 11-12 illustrates product wafers having a semiconductor layer bonded thereon being subjected to electromagnetic radiation to strengthen the bonding of the semiconductor layer to the product wafer, according to various embodiments. FIG. 11 shows a product wafer 620 having a semiconductor layer 618 bonded on bulk region 622 of product wafer 620. Product wafer 620 also includes a dielectric region 624 to which semiconductor layer 618 is bonded. An interface region 625 having modifiers, which can be selected as dopants for the material of semiconductor layer 618, is disposed as part of semiconductor layer 618. Alternatively, modifiers can be disposed in interface region 625 as part of dielectric region 624. Additionally, product wafer 620 can optionally have devices and/or interconnections 623-1 . . . 623-N formed in bulk region 622 of product wafer 620. Such a product wafer, as illustrated in FIG. 11, may be fabricated according to various embodiments as discussed, for example, with respect to FIGS. 1-10. Electromagnetic radiation 615 can be directed to product wafer 620, where electromagnetic radiation 615 can be tuned to a frequency correlated to absorption by modifiers in interface region 625. The power level of electromagnetic radiation 615 can be adjusted based on the application.

FIG. 12 shows a product wafer 640 having a semiconductor layer 638 bonded on bulk region 642 of product wafer 640. Unlike product wafer 620, product wafer 640 does not include a dielectric region to which semiconductor layer 638 is bonded. An interface region 645 having modifiers, which can be selected as dopants for the material of semiconductor layer 638, is disposed as part of semiconductor layer 638. Alternatively, modifiers can be disposed in interface region 645 of bulk region 642 to which semiconductor layer 638 is bonded. Additionally, product wafer 640 can optionally have devices and/or interconnections 643-1 . . . 643-N formed in bulk region 642 of product wafer 640. Such a product wafer, as illustrated in FIG. 6B, may be fabricated according to various embodiments as discussed, for example, with respect to FIGS. 1-10. Electromagnetic radiation 635 can be directed to product wafer 640, where electromagnetic radiation 635 can be tuned to a frequency correlated to absorption by modifiers in interface region 645. The power level of the electromagnetic radiation 635 can be adjusted based on the application.

Figure 13:
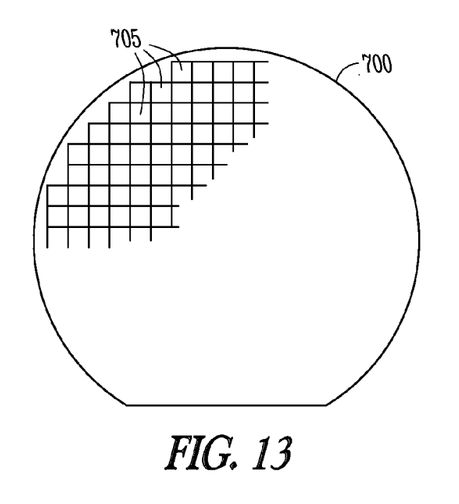
FIG. 13 illustrates a finished wafer 700, according to various embodiments of the invention.

FIG. 13 illustrates a finished wafer 700, according to various embodiments. Wafer 700 can be provided as a semiconductor on insulator wafer in which a plurality of dies 705 can be fabricated. Alternatively, wafer 700 can be provided as a semiconductor on insulator wafer in which the plurality of dies 705 structures that have been processed to provide electronic functionality and are awaiting singulation from wafer 700 and packaging. Wafer 700 can be fabricated in accordance with embodiments related to FIGS. 1-12.

Each die 705 may include devices and or interconnections in the bulk of wafer 700 with other devices to be formed in a semiconductor layer bonded to the bulk of wafer 700. Using various masking and processing techniques, dies 705 can be further processed to include functional circuitry such that each die 705 is fabricated as an integrated circuit with the same functionality and packaged structure as the other die on wafer 700. Alternatively, using various masking and processing techniques, various sets of die 705 can be processed to include functional circuitry such that not all of the dies 705 are fabricated as an integrated circuit with the same functionality and packaged structure as the other dies on wafer 700. A packaged die having circuits integrated thereon providing electronic capabilities is herein referred to as an integrated circuit (IC). Performance of such semiconductor based electronic devices can be improved through the enhancement of fabrication processes for semiconductor on insulator structures in accordance with various embodiments as described herein.

Figure 14:
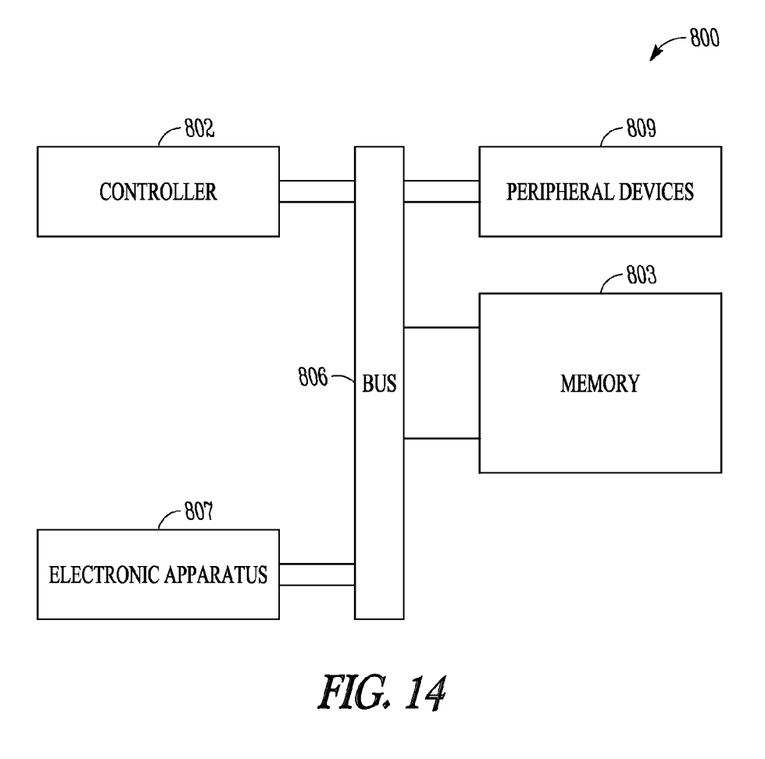
FIG. 14 shows a block diagram of various features of an electronic system, according to various embodiments of the invention.

FIG. 14 shows a block diagram of a system 800 that includes one or more ICs structured with a semiconductor layer bonded to a bulk region of a substrate, according to various embodiments. The semiconductor layer and/or the bulk region of the substrate contain devices and interconnections that form the circuitry for an IC. The substrate and semiconductor layer can be provided from a wafer according to various embodiments discussed herein.

System 800 includes a controller 802 and a memory 803. In various embodiments, system 800 also includes an electronic apparatus 807 and peripheral devices 809. One or more of controller 802, memory 803, electronic apparatus 807, and peripheral devices 809 can be in the form of one or more ICs. A bus 806 provides electrical conductivity between and/or among various components of system 800. In an embodiment, bus 806 includes an address bus, a data bus, and a control bus, each independently configured. In an alternative embodiment, bus 806 uses common conductive lines for providing one or more of address, data, or control, the use of which is regulated by controller 802. Controller 802 can be in the form or one or more processors.

Electronic apparatus 807 may include additional memory. Memory in system 800 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, and magnetic based memory.

Peripheral devices 809 may include displays, imaging devices, printing devices, wireless devices, additional storage memory, and control devices that may operate in conjunction with controller 802. In various embodiments, system 800 includes, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Thus, the following claims are hereby incorporated into the Detailed Description, with each claim standing on its own as a separate embodiment.

What is claimed is:
1. A method comprising:
strengthening a bonding of a semiconductor layer to a bulk region of a product wafer by irradiating an interface region with electromagnetic radiation, the interface region disposed between the bonded semiconductor layer and the bulk region, the interface region having modifiers, the modifiers being different from bulk material of the product wafer, the electromagnetic radiation tuned to a frequency correlated to absorption by the modifiers.

2. The method of claim 1, wherein the method comprises introducing the modifiers to a donor wafer from which the semiconductor layer detaches in a process that bonds the semiconductor layer to the product wafer.

3. The method of claim 1, wherein the method comprises forming the semiconductor layer from a donor wafer by:
   bonding the donor wafer to the product wafer;
   implanting material as ions into a region of the donor wafer at a distance from the surface; and
   imparting energy to the implanted material to disunite the donor wafer from the product wafer with the semiconductor layer bonded to the product wafer.

4. The method of claim 3, wherein imparting energy to the implanted material to disunite the donor wafer from the product wafer with the semiconductor layer bonded to the product wafer includes exposing modifiers in the donor wafer to electromagnetic radiation, the electromagnetic radiation tuned to a frequency correlated to absorption by the modifiers in the donor wafer.

5. The method of claim 4, wherein the method comprises introducing modifier material in the donor material that is the same for the interface region and for disuniting the donor wafer from the product wafer.

6. The method of claim 1, wherein the method comprises selecting the frequency and a power level correlated to a material composition of a dielectric region disposed between the bulk region and the bonded semiconductor layer.

7. The method of claim 1, wherein the interface region is disposed as a portion of a dielectric region between the bulk region and the bonded semiconductor layer.

8. A method comprising:
   strengthening a bonding of a silicon layer to a silicon product wafer by irradiating an interface region with microwaves, the interface region disposed between a bulk silicon region of the silicon product wafer and the silicon layer, the interface region having modifiers, the modifiers being a material different from silicon, the microwaves tuned to a frequency correlated to absorption by the modifiers.

9. The method of claim 8, wherein the modifiers include phosphorous, arsenic, boron, or combinations thereof.

10. The method of claim 8, wherein the method comprises forming a modifier in the interface with a concentration ranging from about $10^{13}$ cm$^{-3}$ to about $10^{16}$ cm$^{-3}$.

11. The method of claim 8, wherein strengthening the bonding of the silicon layer to the silicon product wafer comprises strengthening the bonding of the silicon layer to an oxide layer to which the silicon layer is bonded.

12. The method of claim 8, wherein irradiating the interface region with microwaves includes irradiating the interface region with microwaves at a power level to activate the modifiers as dopants of the silicon product wafer.

13. The method of claim 8, wherein strengthening the bonding of the silicon layer to the silicon product wafer comprises strengthening the bonding of the silicon layer to the silicon product wafer having devices constructed therein.

14. The method of claim 8, wherein irradiating the interface region with microwaves includes irradiating the interface region with microwaves having a peak frequency in the range from about 5.7 GHz to about 6.0 GHz.

15. The method of claim 8, wherein the method includes processing the silicon product wafer such that a plurality of dies are formed on the silicon product wafer, each die having electronic functionality.

16. The method of claim 15, wherein the method includes conducting singulation of the dies from the silicon product wafer and packaging the dies.

* * * * *